United States Patent
Ham et al.

(10) Patent No.: US 8,630,074 B2
(45) Date of Patent: Jan. 14, 2014

(54) OVER-TEMPERATURE PROTECTED TRIAC AND PROTECTION METHOD

(75) Inventors: Nicholas John Ham, Stockport (GB); Ed Huang, Stockport (GB); Jianfeng Zhang, Shanghai (CN); Andrew Mark Warwick, Wickham (GB); Andrew Butler, Blackpool (GB); Minghaoi Jin, Shanghai (CN)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/433,582

(22) Filed: Mar. 29, 2012

(65) Prior Publication Data
US 2012/0250200 A1     Oct. 4, 2012

(30) Foreign Application Priority Data
Mar. 31, 2011 (EP) .................................. 11160706

(51) Int. Cl.
*H02H 9/00* (2006.01)
*H02H 5/04* (2006.01)

(52) U.S. Cl.
USPC ........................................... 361/57; 361/103

(58) Field of Classification Search
None
See application file for complete search history.

(56) References Cited

U.S. PATENT DOCUMENTS

| | | | |
|---|---|---|---|
| 3,792,324 A * | 2/1974 | Suarez et al. | 318/786 |
| 3,920,955 A | 11/1975 | Nakata | |
| 3,946,252 A * | 3/1976 | Juodikis | 327/458 |
| 3,971,056 A | 7/1976 | Jaskolsi et al. | |
| 4,087,848 A * | 5/1978 | Hyink et al. | 361/103 |
| 4,142,115 A | 2/1979 | Nakata et al. | |
| 7,872,428 B1 * | 1/2011 | Papanicolaou | 315/291 |

OTHER PUBLICATIONS

Extended European Search Report for European patent appln. No. 11160706.5 (Aug. 31, 2011).

\* cited by examiner

*Primary Examiner* — Dharti Patel

(57) ABSTRACT

A triac circuit comprises a triac having first and second main terminals (MT1,MT2) and a gate terminal and a thyristor connected between one of the main terminals (MT1,MT2) and a control terminal of the triac circuit. The thyristor is used to prevent turn on of the triac when it has turned on by temperature induced leakage currents.

15 Claims, 9 Drawing Sheets

OVER-TEMPERATURE PROTECTED TRIAC AND PROTECTION METHOD

CROSS-REFERENCE TO RELATED APPLICATIONS

This application claims the priority under 35 U.S.C. §119 of European patent application no. 11160706.5, filed on Mar. 31, 2011, the contents of which are incorporated by reference herein.

This invention relates to triacs.

A triac is an electronic component which can conduct current in either direction when it is triggered.

A triac is approximately equivalent to two complementary unilateral thyristors joined in inverse parallel. It can be triggered by either a positive or a negative current being applied to its gate electrode. Once triggered, the device continues to conduct until the current through it drops below a certain threshold value, the holding current, such as at the end of a half-cycle of alternating current (AC) mains power. This makes the triac a very convenient switch for AC circuits, allowing the control of power flows.

By convention, a triac has two main terminals MT1 and MT2 and a gate terminal. When the voltage on the main terminal MT1 is positive with regard to the voltage on the other main terminal MT2, and either a positive or negative gate current is applied, one of the internal thyristors conducts. When the voltage is reversed and a positive or negative gate current is applied to the gate, the other internal thyristor conducts. This is provided that there is sufficient voltage across the device to enable a minimum holding current to flow.

In a real application, if a short circuit load fault occurs, excessive current will flow through the triac until the chip overheats and fails. This is one of the most common failure modes of triacs.

There is therefore a need to be able to turn off the triac when it becomes too hot and before device failure. A triac always turns off at the end of an AC half-cycle, but it turns on again if a gate trigger signal is present. Thus, there is a need for a triac circuit that is able to detect that it has reached a critical temperature, and then refuse to be turned on at the next half-cycle even if a gate trigger signal is present.

However, to limit cost, there is a need to implement this circuit with few additional components and preferably in a way which simplifies integration of the additional circuit components with the triac.

According to the invention, there is provided a triac circuit comprising:

a triac having first and second main terminals and a gate terminal; and a thyristor connected between one of the main terminals and a control terminal of the triac circuit.

The thyristor can be any thyristor-type structure, namely one having at least four layers of alternating N and P type material. The term "thyristor" should be understood accordingly.

The function of the thyristor is to prevent the gate control signal applied to the control terminal from being applied to the gate terminal of the triac when the thyristor becomes hot. The thyristor is preferably connected to the MT1 terminal of the triac.

The thyristor is an additional component between the control terminal and one of the main terminals of the triac, to provide a parallel path for the applied gate current. This parallel path should become very low impedance when hot, effectively shorting out the control terminal to the main terminal and "robbing" the triac of any gate current. Thus, any applied gate current preferentially flows through this low impedance parallel path rather than through the internal PN junction structure in the triac. In this way, the thyristor functions as a temperature sensitive switch.

A number of semiconductor components or structures, which have temperature-dependent conduction characteristics such that current would increase greatly with rising temperature, could be used in this position to rob the triac of gate current and thus disable its turning on. However, because the triggering characteristics of a triac is not the same in both directions, use of such components would likely lead to "half-waving", with one direction of conduction being disabled at a lower temperature than the other. This "half-waving" can lead to undesirable saturation of inductive loads. This is why a thyristor-like structure is needed to provide this function: It has two stable states and at a certain temperature will rapidly switch from a blocking state to a short circuit state. The difference between the two states is sufficient to ensure that both directions of the triac triggering are disabled at the same time.

The thyristor also provides a rapid changeover, as a result of the two stable states, and can rapidly switch from a blocking state to a short circuit state.

The thyristor is preferably designed so that it will be turned on by its own thermally generated leakage current in the desired temperature control range.

A voltage drop element such as a diode can be provided between the control terminal and the gate terminal. This functions to increase the drive voltage required to be applied to the control terminal, and means that the thyristor is more effective in providing a short circuit path. The diode thus functions to raise the threshold voltage of the gate, so that the thyristor can switch off the triac more effectively. The control gate terminal is preferably connected to the cathode of the diode and the cathode of the thyristor.

The gate of the thyristor is preferably open circuit, so that no external control signal is required. With a thyristor with suitable sensitivity, it can self-trigger into the on-state when it is hot.

For example, the thyristor can be adapted to turn on as a result of leakage currents when a temperature is reached which is in the range 100 to 200° C.

Preferably, the thyristor comprises a single direction device, and most preferably a silicon controlled rectifier (SCR). When the thyristor is implemented as a silicon controlled rectifier, it provides a cheap and simple solution to disable the gate of the triac when hot.

The invention also provides a method of providing temperature protection for a triac, comprising forming a triac circuit including the triac and a thyristor in a path between a control terminal of the triac circuit and a main terminal of the triac.

Examples of the invention will now be described in detail with reference to the accompanying drawings, in which.

The invention provides a triac circuit comprising a triac having first and second main terminals and a gate terminal, and a thyristor connected between one of the main terminals and a control terminal of the triac circuit.

Figure 1:
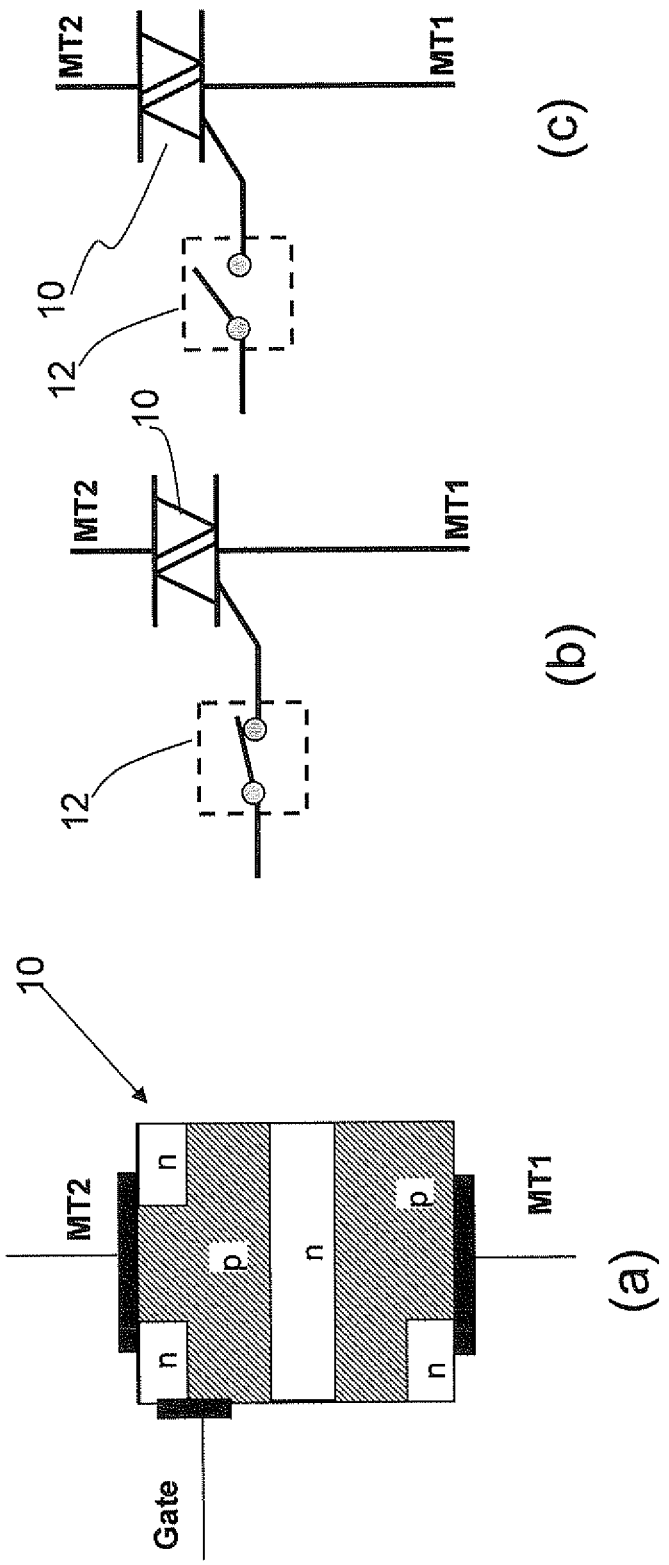
FIG. 1 shows the structure of a triac and the conceptual function of the circuit of the invention.

FIG. 1 shows conceptually the desired circuit operation of the circuit of the invention. The triac 10 (otherwise known as a bidirectional triode thyristor) functions as a pair of thyristors in anti-parallel with a single gate terminal. An example of the structure is shown in FIG. 1(a). There are two main terminals MT1 and MT2 and a gate.

As shown in FIGS. 1(b) and (c), it is desired to be able to isolate the control input signal to a triac 10 from the triac gate, by means of a form of switching device 12. FIG. 1(b) shows the low temperature situation, when the control signal at the circuit input is passed to the triac gate, and FIG. 1(c) shows the high temperature situation with the control signal isolated from the gate.

Rather than having a series switch as shown in FIG. 1, the invention is based on the use of a component between the triac gate and one of the main terminals MT1, MT2.

As shown in FIG. 2(a) a switching device 20 is between the gate and one of the main terminals, and is open during low temperatures, so that the triac 10 operates as normal. When a high temperature is detected, the switching device 20 closes as shown in FIG. 2(b) and provides a lower resistance path for the control signal to one of the main terminals, thus preventing the control signal current reaching the triac gate.

For the purposes of this explanation, the signal applied to the circuit input is termed the control input, and this is applied to the control terminal. The resulting signal on the gate of the triac is termed the gate signal and the gate of the triac is termed the gate terminal.

Figure 2:
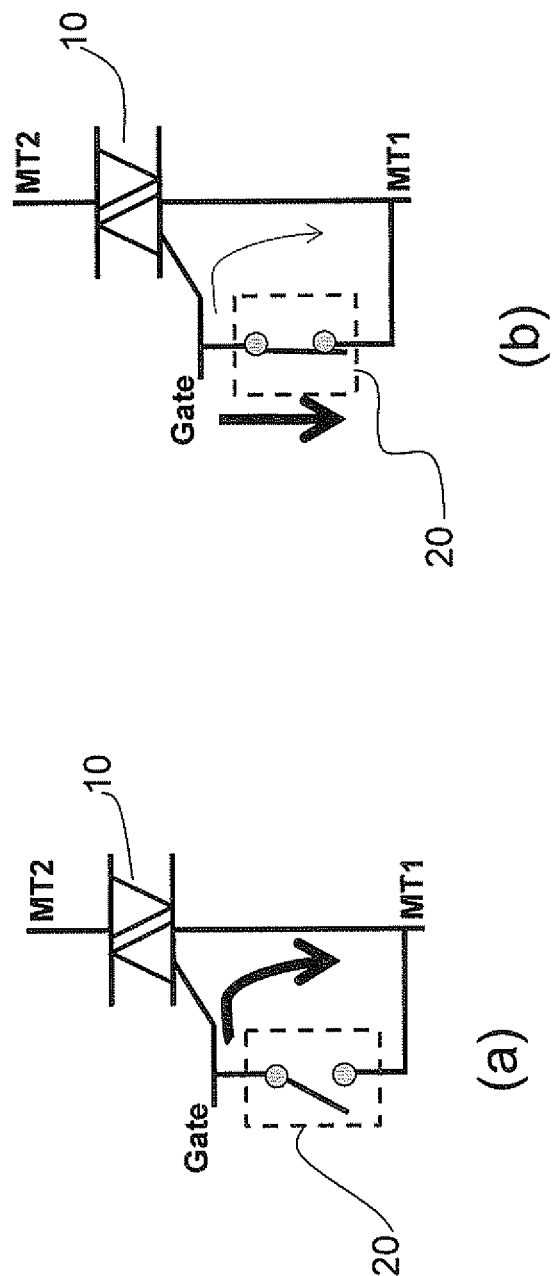
FIG. 2 shows how the circuit of the invention provides an alternative path for the triac gate current.
Figure 3:
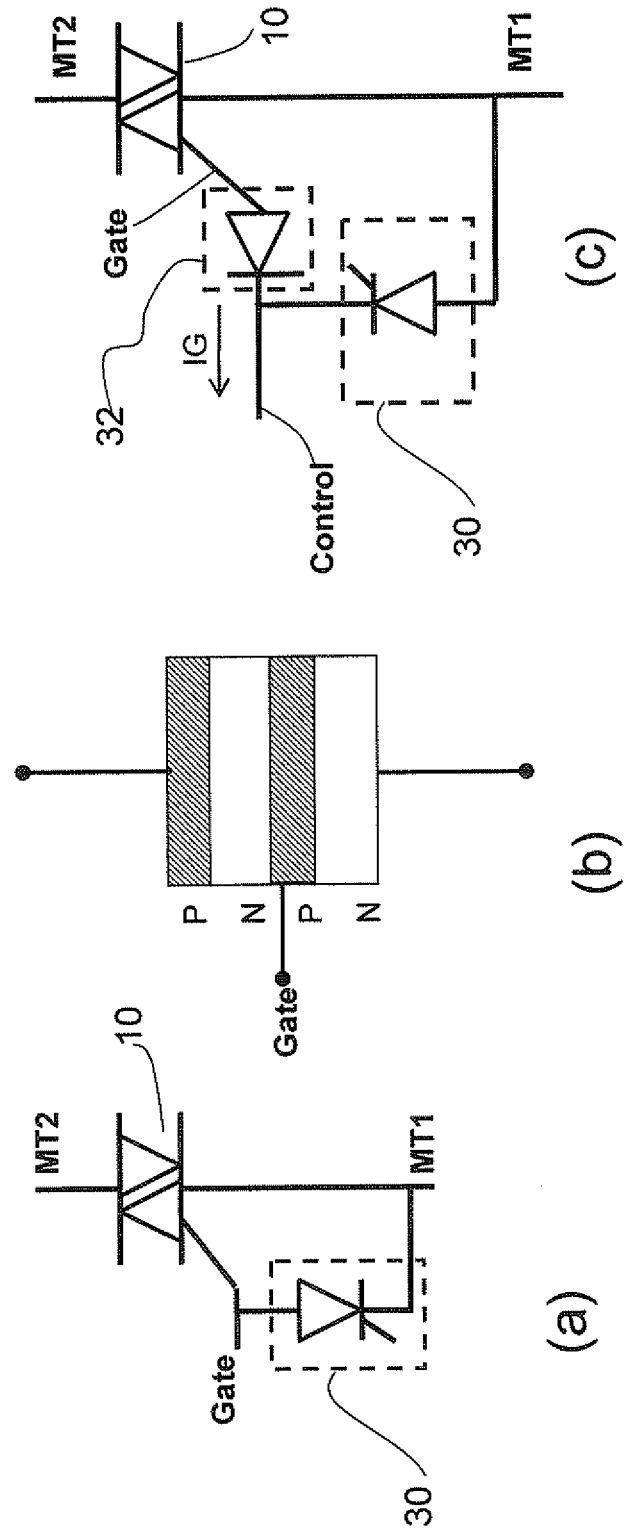
FIG. 3 shows the structure of a thyristor and shows two examples of circuit of the invention.

FIG. 3(a) shows a first implementation of the invention, in which the switching device 20 of FIG. 2 is implemented as a thyristor 30, for example the simplest form of thyristor, the reverse blocking triode thyristor, often referred to as a silicon controlled rectifier. However, other thyristor designs can be used.

FIG. 3(b) shows the four layer structure of a thyristor, comprising a p-n-p-n stack with a control gate at one of the intermediate stack layers.

The invention is based on the use of the principle that a thyristor can be turned on by leakage currents. These leakage currents rise with temperature, and if the junction temperature is allowed to rise sufficiently, latching of the regenerative loop of the thyristor is initiated, thereby allowing forward conduction.

The gate of the thyristor is open circuit, i.e. it is not externally connected, so that no switch-on signal is applied to the gate, and indeed no signal connection to the thyristor gate needs to be made.

During operation of the circuit of FIG. 3(a), the thyristor is initially in its blocking (open circuit) state, as its gate is open circuit. The externally applied control signal (in the form of a gate current) applied to the triac will flow normally in the triac gate structure to turn the triac on.

If the triac/thyristor combination gets very hot, the thyristor will self-turn-on to a low impedance state. With a suitably low on-state voltage, all of the gate current will now preferentially flow through the thyristor, robbing the triac of any gate current.

After the thyristor is self-triggered by an over-temperature event, it remains in the on-state as long as the current from the control terminal remains applied to the triac circuit, and as long as this current is above the holding current of the thyristor. In this way, the triac remains disabled even when the overload condition has passed and the temperature has dropped.

After the gate voltage at the control terminal is reset to zero (to halt the current flow through the thyristor) and the temperature is lower than the trip point, the triac will start working as normal again.

The circuit of FIG. 3(a) has been tested using discrete components. A sensitive thyristor can be used, which is most likely to self-turn-on by temperature alone. The circuit has been shown to function correctly. However, careful choice of the components is needed for the on-state voltage of the thyristor to drop sufficiently below the gate trigger voltage of a typical triac.

To provide greater freedom in the choice of components to use, the circuit of FIG. 3(c) can be used. This circuit provides a diode 32 between the control input terminal ("control") and the gate terminal ("gate"), and the thyristor is between the control terminal and one of the main terminals (MT1 in this example).

Thus, the diode and thyristor are in series between the triac gate and one of the main terminals, and the junction between them forms the control input terminal.

The purpose of the diode 32 is to raise the gate trigger voltage of the triac 10.

The total effective threshold voltage (the gate threshold voltage of the triac added to the forward voltage of the diode) is then higher than the on-state threshold voltage of the thyristor. When the thyristor turns on it disables the triac completely in both directions.

The direction of the thyristor has been inverted compared to the FIG. 3(a). This therefore relates to an implementation with negative gate triggering. Most gate triggering circuits for high current loads work using a negative gate current.

The invention can thus be applied to positive gate current and negative gate current triac circuits. When a diode is used, the diode orientation is of course chosen appropriately—so that it conducts the triac gate current in the forward bias direction.

The thyristor is designed to be used simply as a temperature switch, with no external control signal applied.

The overall circuit (triac+thyristor or triac+thyristor+diode) can be fabricated in a variety of ways.

Ideally, all components should be integrated into the same package as the normal triac. The user can then connect the normal load current leads to MT1 and MT2 and gate control lead to the control terminal. The circuit can remain as a three terminal circuit. The device provides the normal triac behaviour plus the over-temperature protection. If desired, a terminal can be provided for access to the gate terminal of the triac, so that the over-temperature protection circuit can be bypassed (this would give a four terminal circuit).

The thyristor should be in close thermal contact with the triac, so that over-temperature in the triac (due to overload for whatever reason) causes the thyristor to self-trigger and disable the triac.

Figure 4:
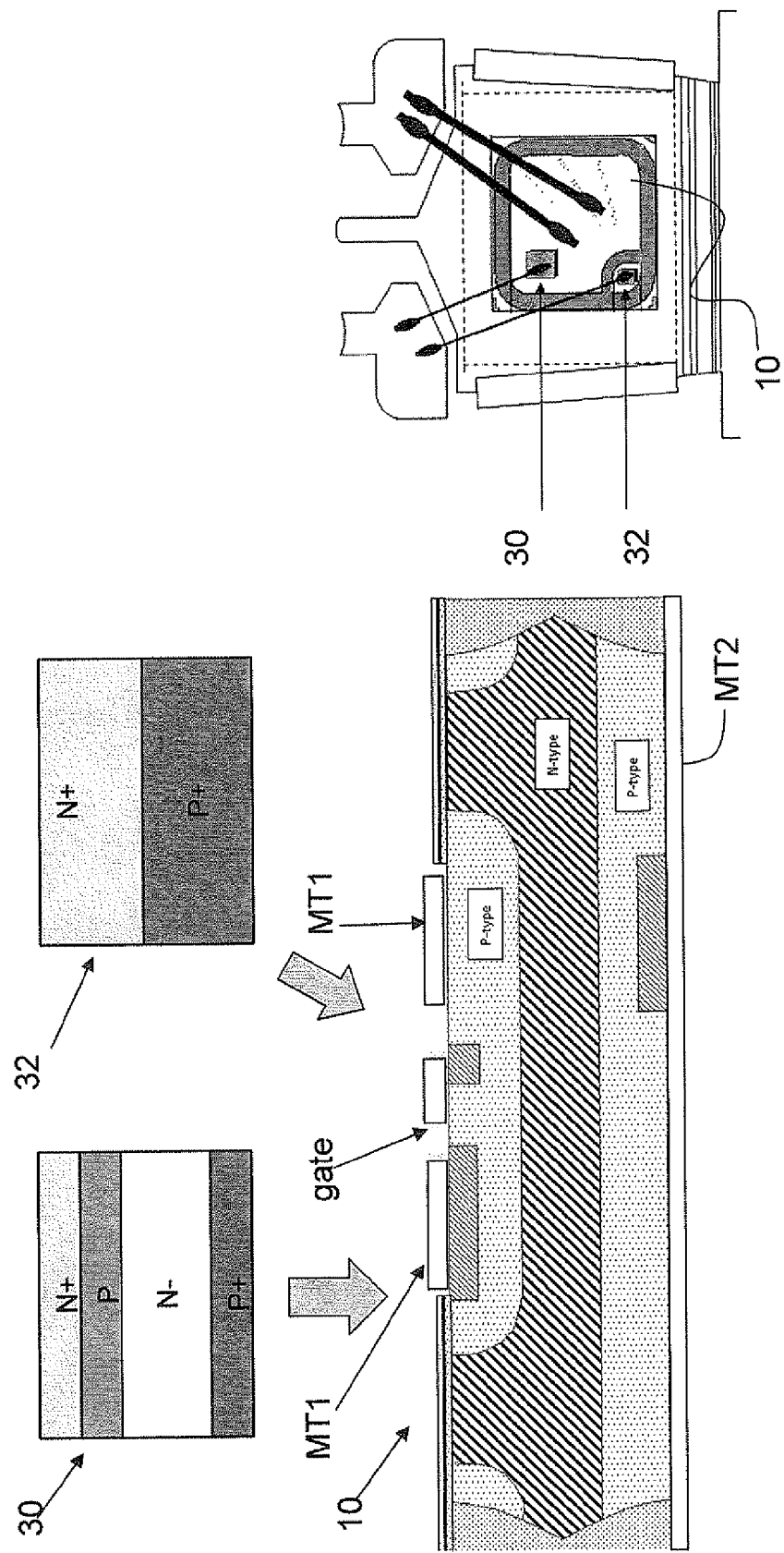
FIG. 4 shows a first way to implement the circuit of the invention.

A first way to implement the circuit is shown schematically in FIG. 4.

The three discrete components—thyristor 30, diode 32 and triac 10 are provided as discrete chips mounted into one package. As shown in FIG. 4, the thyristor 30 and diode 32 are surface mounted over the contact pads of the triac 10. This is the most straightforward solution, and can easily be tested. The triac needs to be designed to be able to fit the diode 32 on the gate.

In the example shown in FIG. 4, the thyristor is shown positioned to one side of the active area of the triac. This will protect more effectively against overload in one half of the structure (corresponding to either positive or negative load current), but heat from overload in the other half has to reach the protected half before the triac is disabled. Therefore, the single protection thyristor may instead be provided in the centre of the active area. Improved protection against fast temperature rise in either half that may result from a short circuit can be obtained by having two protective thyristors in parallel, one in the centre of each triac half. Whichever thyristor trips first will protect the triac. Thus, although a single protection thyristor is shown in FIG. 4 as well as in the other examples below, it should be understood that the invention can be extended to include two (or more) protection thyristors.

Figure 5:
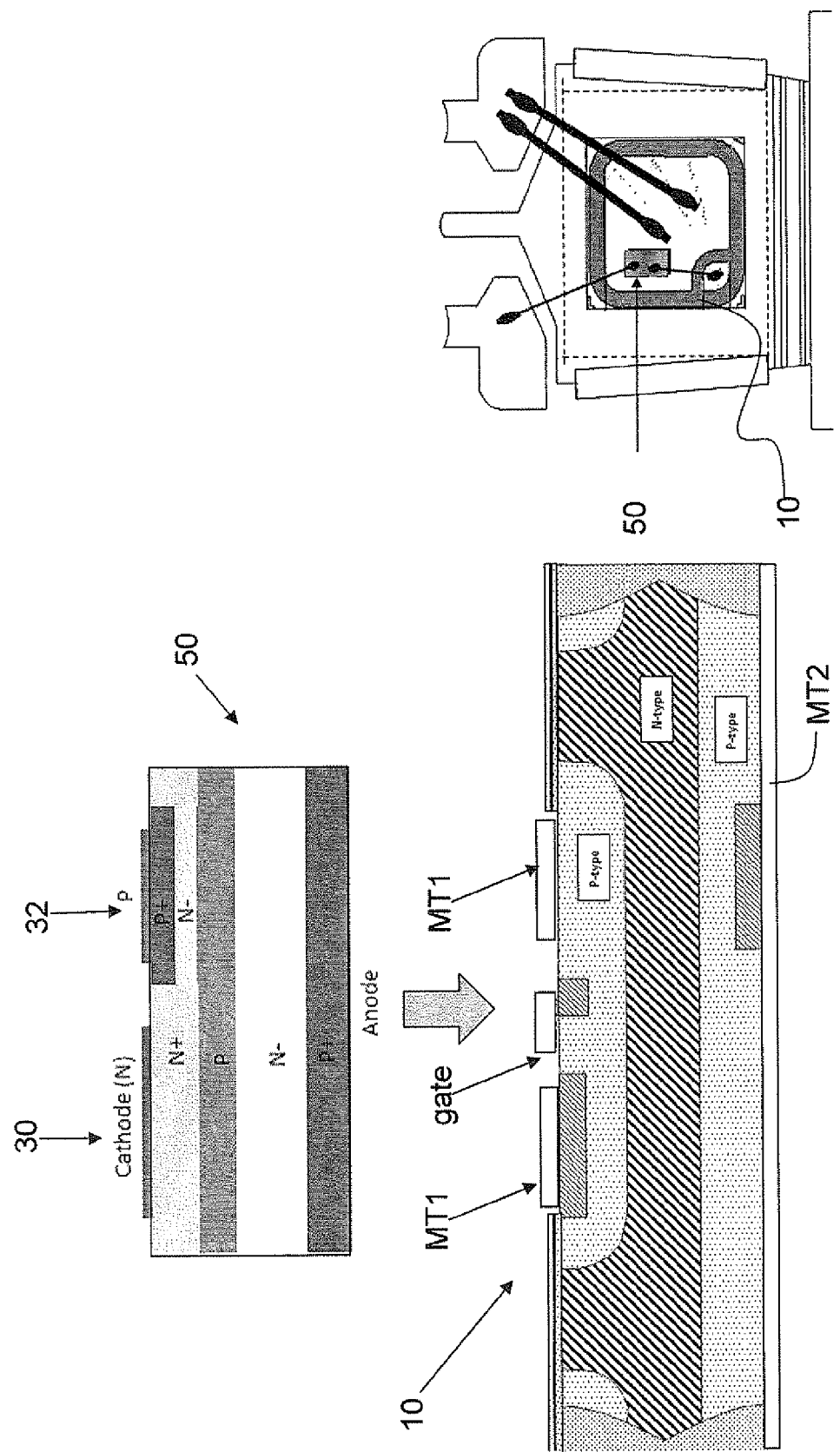
FIG. 5 shows a second way to implement the circuit of the invention.

A second way to implement the circuit is shown schematically in FIG. 5. In this case, there is monolithic integration of the thyristor 30 and diode 32 as a single component 50 which is then attached on top of the standard triac chip 10. This provides a lower assembly or packaging cost solution. The thyristor and diode can be designed as a component which can be applied to different triac designs.

Figure 6:
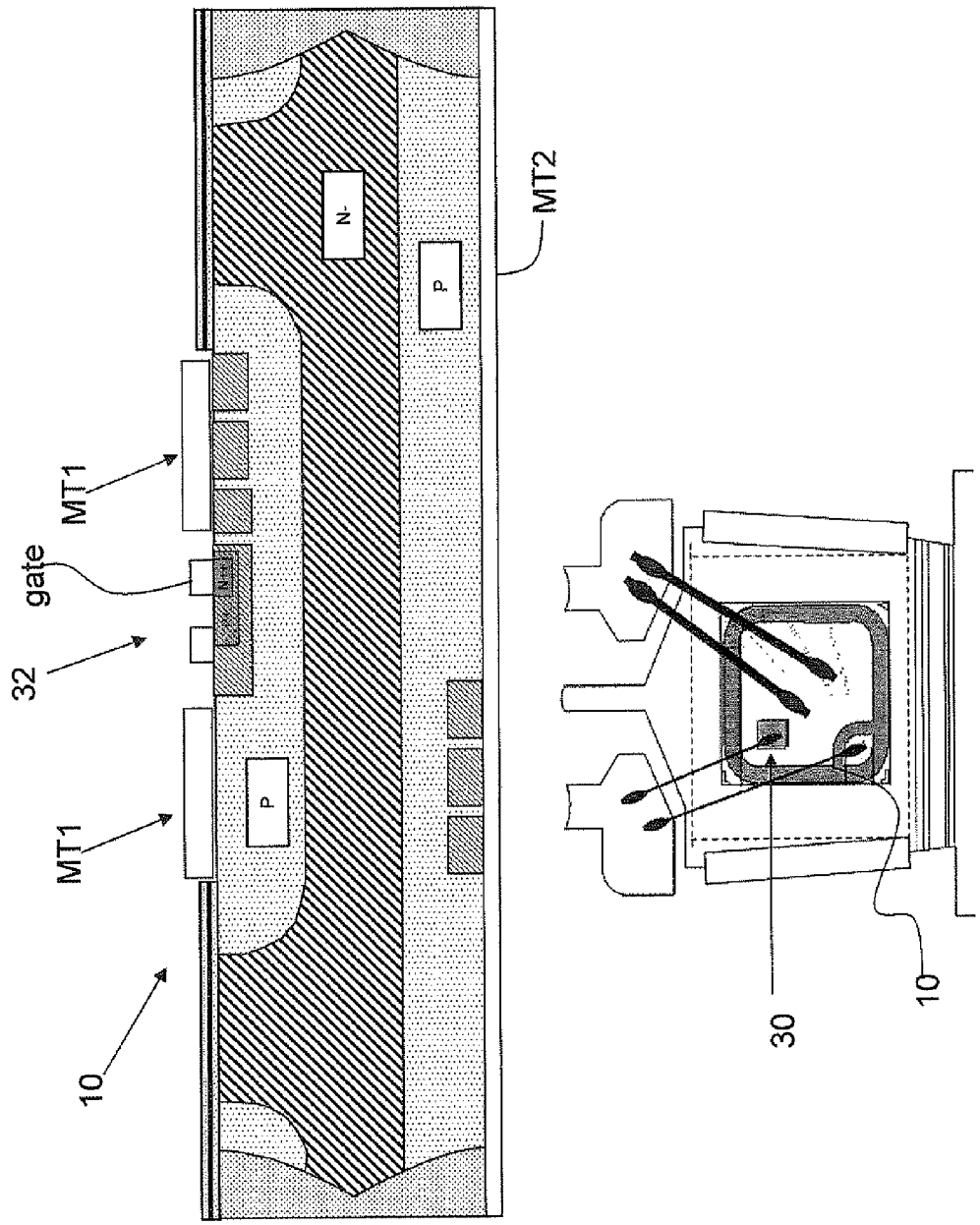
FIG. 6 shows a third way to implement the circuit of the invention.

A third way to implement the circuit is shown schematically in FIG. 6. In this case, there is monolithic integration of the triac 10 and diode 32, then attachment of the thyristor chip 30 on top of the main terminal MT1.

Figure 7:
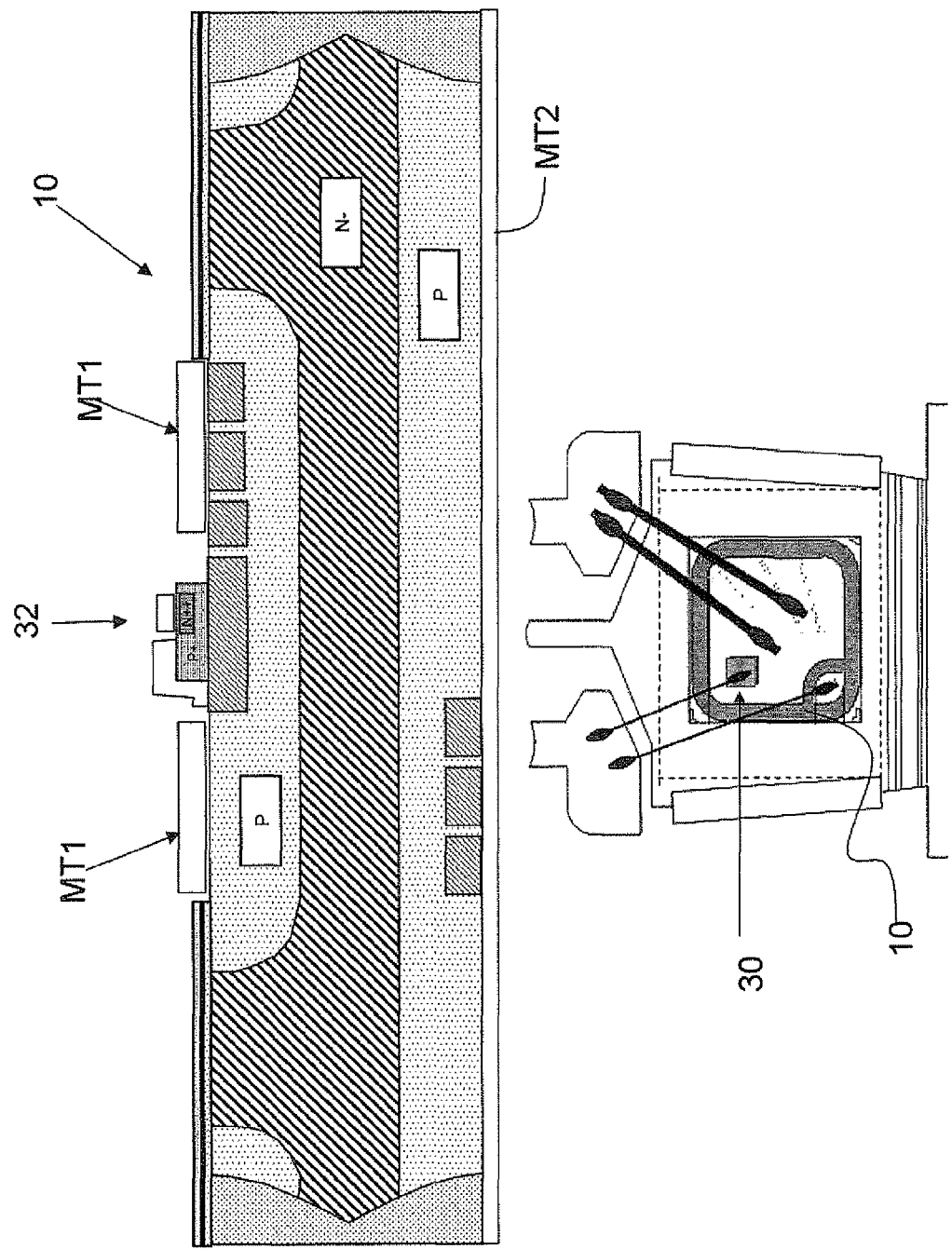
FIG. 7 shows a fourth way to implement the circuit of the invention.

A fourth way to implement the circuit is shown schematically in FIG. 7. This design provides integration of the triac and diode using a polysilicon diode on the gate region, then attachment of the thyristor chip 30 on top.

Figure 8:
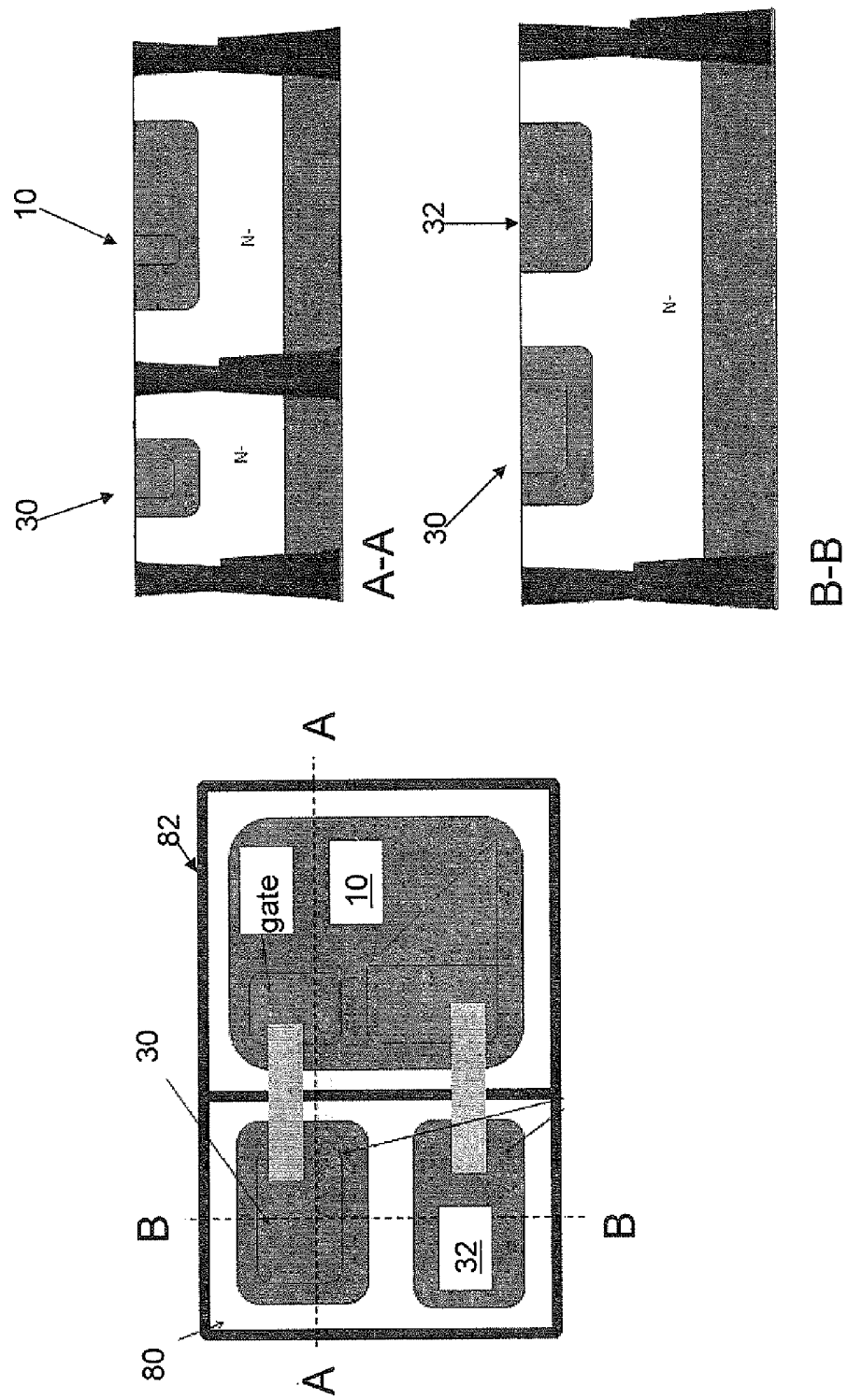
FIG. 8 shows a fifth way to implement the circuit of the invention.

A fifth way to implement the circuit is shown schematically in FIG. 8, in which the triac, thyristor and diode are integrated into one chip. In this design, a single wafer 80 is divided into different areas for the triac 10, thyristor 30 and diode 32. An isolation diffusion area 82 separates the triac from the diode and thyristor. In this example, each device comprises a p-well in an n− substrate, and these p-wells can all be formed at the same time. The thyristor 30 has a further n-type region which can be formed at the same time as the emitter of the triac.

This approach essentially provides the three components side by side in the wafer, with shared processing of layers.

Figure 9:
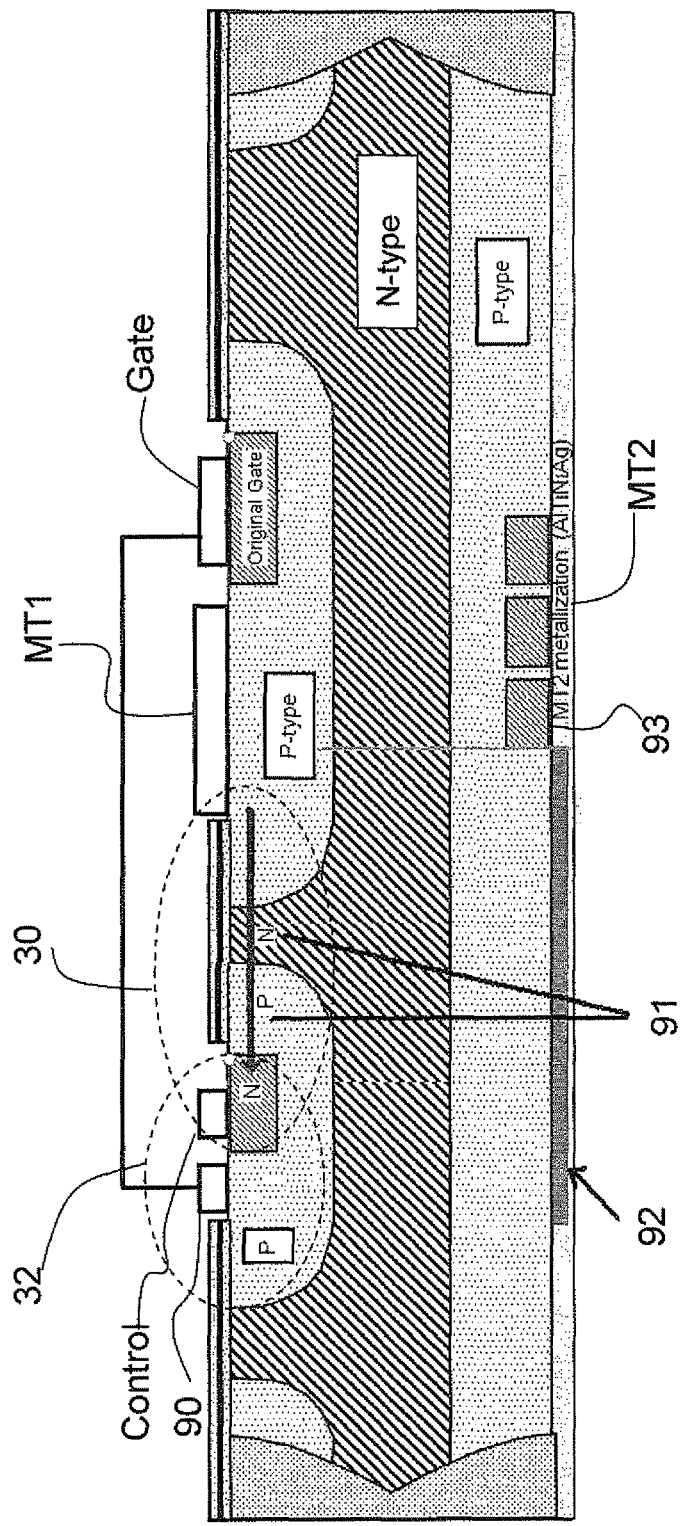
FIG. 9 shows a sixth way to implement the circuit of the invention.

Even more aggressive integration of the components is shown in FIG. 9.

Additional diffusion areas are used to define the n-p-n-p structure of the thyristor 30 between the MT1 terminal and the control terminal, and to define the p-n structure of the diode 32. As shown, an n-type region is shared between them.

The control terminal ("control") connects to a gate contact 90 through the diode 32, and this gate contact 90 then connects to the triac gate through a metal bus line on the chip.

The junction widths can be adjusted, as shown at 91, to adjust the temperature sensitivity of the thyristor. The processing can be adjusted to avoid mis-triggering when the thyristor turns on, for different operating quarters, for example by adding oxides as shown at 92 (for quarter 2) and moving N+ regions 93 (for quadrant 3).

There are many other options and embodiments to implement this concept, including monolithically integrating any of the 2 components on the same silicon chip and connecting the third using assembly techniques, or monolithically integrating all components.

The integration examples above all include the use of a diode. However, the invention can be implemented with a suitable triac and thyristor alone, which of course further simplifies the integration of components. Furthermore, a diode is not the only component which can be used to create a voltage step. For example, a resistor can be used, although this is suitable only for relatively constant gate currents, since the voltage drop will depend on the current. Other discrete devices can also be used to provide a voltage drop, as will be apparent to those skilled in the art.

In the examples above, the thyristor is provided between the control terminal and one of the main terminals. However, this does not need to be a direct connection and there may be other components in the path.

Various other modifications will be apparent to those skilled in the art.

The invention claimed is:

1. A triac circuit comprising:
a triac having first and second main terminals and a gate terminal, for receiving a triac trigger current; and
a thyristor, having a holding current which is less than the triac trigger current, transitioning to an on-state in response to a temperature, and remaining in the on-state in response to the triac trigger current without the temperature, connected between one of the main terminals and the gate terminal of the triac.

2. A triac circuit as claimed in claim 1, wherein the thyristor is adapted such that it will be turned on by its own thermally generated leakage current when raised to the temperature.

3. A triac circuit as claimed in claim 1, wherein the thyristor comprises an SCR.

4. A triac circuit as claimed in claim 1, wherein the thyristor is connected between one of the main terminals and a control terminal, further comprising a voltage drop element between the control terminal and the gate terminal.

5. A triac circuit as claimed in claim 1, wherein the voltage drop element comprises a diode.

6. A triac circuit as claimed in claim 5, wherein the control terminal is connected to the cathode of the diode and a cathode of the thyristor.

7. A triac circuit as claimed in claim 1, wherein a gate terminal of the thyristor is open circuit.

8. A triac circuit as claimed in claim 1, wherein the thyristor is adapted to turn on as a result of leakage currents when the temperature is in the range of about 100° C. to about 200° C.

9. A method of providing temperature protection for a triac, comprising;
forming a triac circuit including the triac, for receiving a triac trigger current, and a thyristor, having a holding current which is less than the triac trigger current, transitioning to an on-state in response to a temperature, and remaining in the on-state in response to the triac trigger current without the temperature, in a path between a gate terminal of the triac circuit and a main terminal of the triac.

10. A method as claimed in claim 9, wherein the thyristor is connected between the main terminal and a control terminal, further comprising providing a voltage drop element between the control terminal and the gate terminal.

11. A method as claimed in claim 10, wherein the voltage drop element comprises a diode.

12. A method as claimed in claim 9, comprising leaving a gate terminal of the thyristor open circuit.

13. A method as claimed in claim 9, wherein the thyristor is adapted such that it will be turned on by its own thermally generated leakage current when raised to the temperature.

14. A method as claimed in claim 9, wherein the thyristor is designed to turn on as a result of its own thermally generated leakage currents when the temperature is in the range of about 100° C. to about 200° C.

15. A method as claimed in claim 9, wherein the thyristor comprises an SCR.

\* \* \* \* \*